(12) United States Patent
Ramsbey et al.

(10) Patent No.: US 6,274,433 B1
(45) Date of Patent: Aug. 14, 2001

(54) METHODS AND ARRANGEMENTS FOR FORMING A FLOATING GATE IN NON-VOLATILE MEMORY SEMICONDUCTOR DEVICES

(75) Inventors: Mark Ramsbey, Sunnyvale; Tuan D. Pham, Santa Clara; Yu Sun, Saratoga; Kenneth W. Au, Fremont, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/476,121

(22) Filed: Jan. 3, 2000

Related U.S. Application Data

(62) Division of application No. 08/992,950, filed on Dec. 18, 1997, now Pat. No. 6,034,394.

(51) Int. Cl.$^7$ ............................................. H01L 21/8247
(52) U.S. Cl. ........................................ 438/264; 438/594
(58) Field of Search ............................... 438/257–267, 438/593–594

(56) References Cited

U.S. PATENT DOCUMENTS

| | | |
|---|---|---|
| 5,147,813 * | 9/1992 | Woo . |
| 5,291,440 | 3/1994 | Koyama ............................ 365/185 |
| 5,336,628 * | 8/1994 | Hartmann . |
| 5,493,140 | 2/1996 | Iguchi . |
| 5,512,503 * | 4/1996 | Hong . |
| 5,840,607 | 11/1998 | Yeh et al. ........................... 438/257 |
| 5,856,690 | 1/1999 | Burns et al. . |
| 5,879,991 * | 3/1999 | Lui et al. ............................ 438/261 |
| 5,891,794 * | 4/1999 | Ibok .................................. 438/592 |
| 5,898,197 | 4/1999 | Fujiwara . |
| 5,923,056 | 7/1999 | Lee et al. ............................ 257/192 |
| 6,110,779 * | 8/2000 | Yang et al. ........................ 438/257 |
| 6,124,168 | 9/2000 | Ong .................................. 438/263 |

* cited by examiner

*Primary Examiner*—Richard Booth

(57) ABSTRACT

Methods and arrangements are provided to increase the process control during the fabrication of the floating/control gate configuration in a non-volatile memory semiconductor device. The methods and arrangements effectively reduce the severity of the topology attributable to the space between adjacent floating gates, by advantageously reducing the thickness of the floating gates. The altered topology allows a subsequently formed control gate to be formed without significant surface depressions. Significant surface depressions in the control gate can lead to cracks in the silicide layer that is formed on the control gate. The cracking usually occurs during subsequent thermal processing of the semiconductor device. Thus the disclosed methods and arrangements prevent cracking of the silicide layer on the control gate, which can affect the performance of the semiconductor device by increasing the resistance of the control gate arrangement.

4 Claims, 5 Drawing Sheets

METHODS AND ARRANGEMENTS FOR FORMING A FLOATING GATE IN NON-VOLATILE MEMORY SEMICONDUCTOR DEVICES

This application is a divisional of application Ser. No. 08/992,950 filed Dec. 18, 1997 now U.S. Pat. No. 6,034,394.

TECHNICAL FIELD

The present invention relates to semiconductor devices and manufacturing processes, and more particularly to methods and apparatus associated with non-volatile memory semiconductor devices.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate does not contain a threshold level of electrical charge, then floating gate 16 represents a binary 0. During erasure, the charge is removed from floating gate 16 by way of the erasure voltage applied to source 13a.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxide regions 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as a oxide-nitride-oxide (ONO) layer.

The continued shrinking of the memory cells, and in particular the features depicted in the memory cells of FIGS. 1a–b, places a burden on the fabrication process to deposit/form the floating gate 16 and control gate 26 without creating deleterious effects within the memory cell. Of particular concern caused by the shrinking dimensions is the need to provide adequate isolation between each of the floating gates 16a–c, and between each of the floating gates 16a–c and control gate 26, while also providing an adequately arranged floating/control gate configuration.

SUMMARY OF THE INVENTION

These needs and others are met by the present invention, which provides methods and arrangements that increase the process control during the fabrication of semiconductor devices, and in particular, during the formation of the floating/control gate configuration in a non-volatile memory semiconductor device. In accordance with one aspect of the present invention, it has been found that in certain semiconductor arrangements, the topology created by the space between adjacent floating gates (e.g., 16a and 16b, can be so severe in shape (e.g., deep and narrow) that the silicide layer 28 formed on the overlying control gate 26 often contains significant depressions over the space. These significant depressions can lead to cracks in the silicide layer 28 during subsequent thermal processing of the semiconductor device, which tends to stress the silicide layer 28.

In accordance with one aspect of the present invention, the shape of the open spaces located between floating gates following patterning is reduced in height by making the floating gate thinner. The resulting topology is, therefore, not as severe as it typically would be with a thicker conventional floating gate. The modified topology improves the step coverage of both the control gate material and silicide material, and thereby does not cause significant depressions to form in the subsequently formed silicide layer 28. Consequently, cracking of silicide layer 28 is substantially less likely to occur during the subsequent thermal processes.

Thus, in accordance with certain embodiments of the present invention, a method, and an associated arrangement, are provided. The method includes the steps of forming at least two isolating regions, separated by an isolated region, within a substrate, forming a tunnel oxide on the top surface of the substrate and within the isolated region, and forming a floating gate on at least a portion of the tunnel oxide, wherein the floating gate is less than approximately 900 angstroms thick The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1A:
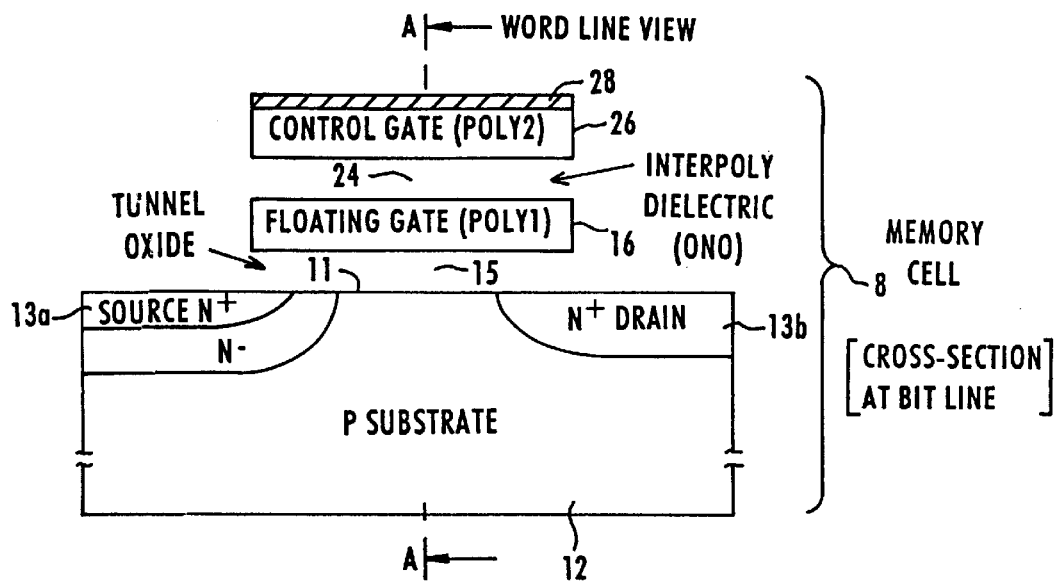
FIGS. 1a–b depict different cross-sectional views of portions of a typical prior art semiconductor device having at least one memory cell.
Figure 1B:
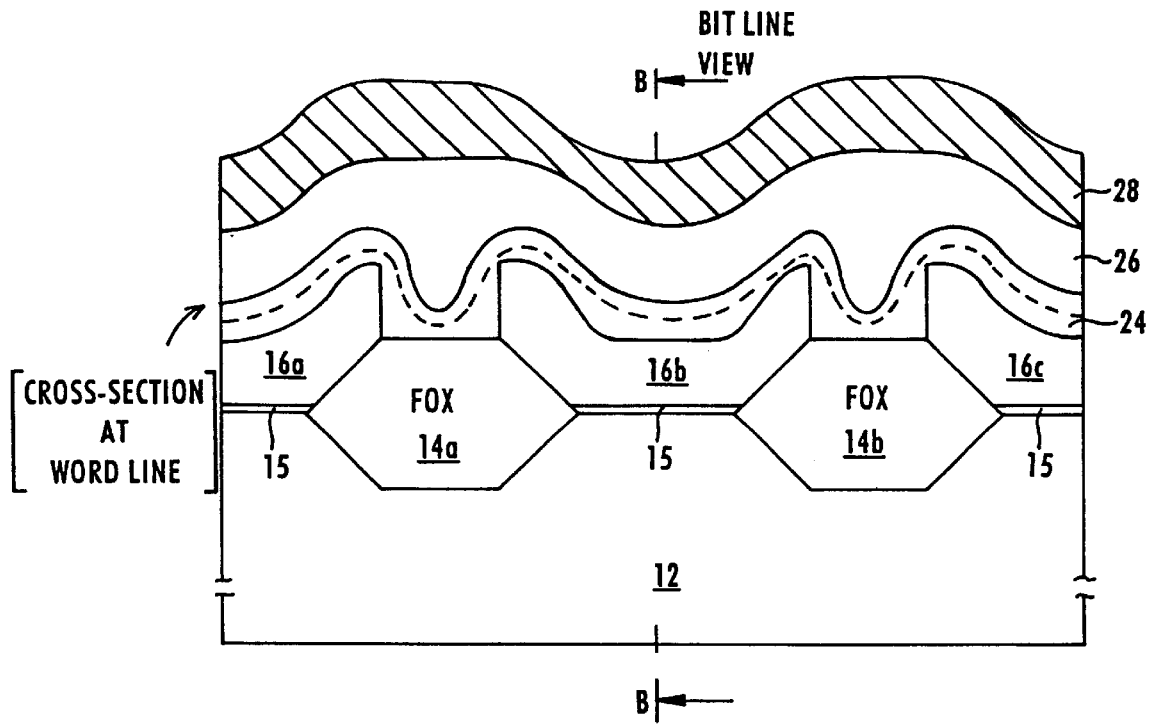
Figure 2A:
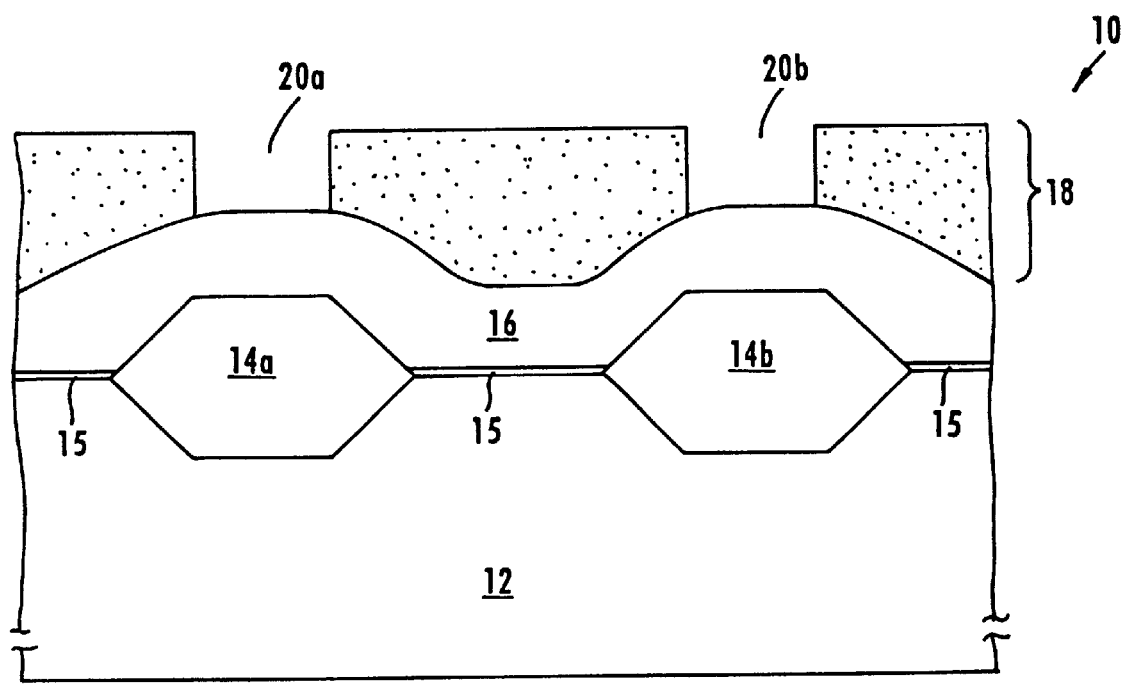
FIGS. 2a–2e sequentially depict cross-sectional views of a portion of a semiconductor device during the formation of a plurality of memory cells, which results in at least one of the memory cells having a control gate arrangement with a damaged or cracked silicide layer.

FIG. 2a represents a portion 10 of a semiconductor device as viewed from a cross-sectional perspective through the word line (similar to FIG. 1b). Portion 10, in FIG. 2a, depicts the formation of floating gates 16a–c from at least one layer of polysilicon. As shown, a conformal polysilicon layer 16 has been formed over substrate 12, tunnel oxide 15, and field oxides 14a–b. Polysilicon layer 16 can be deposited, for example, using conventional deposition techniques, such as, chemical vapor deposition (CVD) or plasma enhanced CVD (PECVD) techniques. To pattern polysilicon layer 16 into floating gates 16a–16c (see FIG. 2b) a mask 18 has been formed and patterned on polysilicon layer 16. Mask 18, which is typically a lithographic mask, includes openings 20a–20b that selectively exposed portions of the underlying polysilicon layer 16. The formation of floating gates 16a–16c includes anisotropic etching, such as certain reactive ion etching (RIE) or plasma etching processes that remove the exposed portions of polysilicon layer 16 through openings 20a–b, and stop on field oxides 14a–b.

Figure 2B:
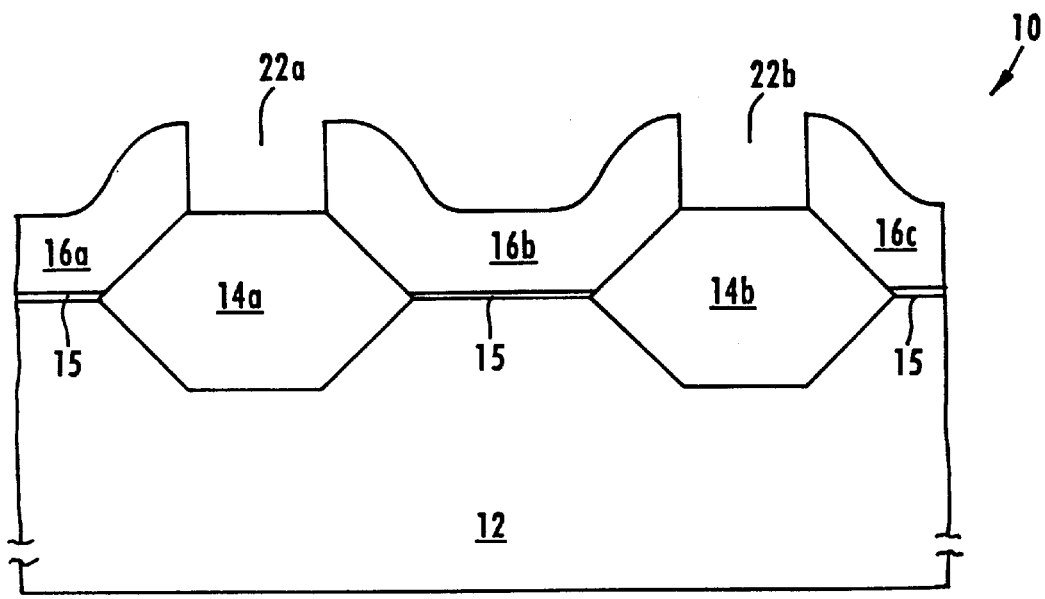

In FIG. 2b, portion 10 has been etched and mask 18 has been stripped away, for example, using conventional stripping techniques, leaving floating gates 16a–c. The etching process creates spaces 22a and 22b. Spaces 22a–22b tend to be relatively narrow in width. For example, in sub-micron flash memories, spaces 22a and 22b can be between about 0.1 and 0.4 microns. Floating gates 16a–c are typically about 900 to 1,100 Angstroms thick. Consequently, the critical dimension of spaces 22a–b represents a significantly severe topology over which the subsequent layers are formed (e.g., interpoly dielectric layer 24, control gate 26 and silicide layer 28).

Figure 2C:
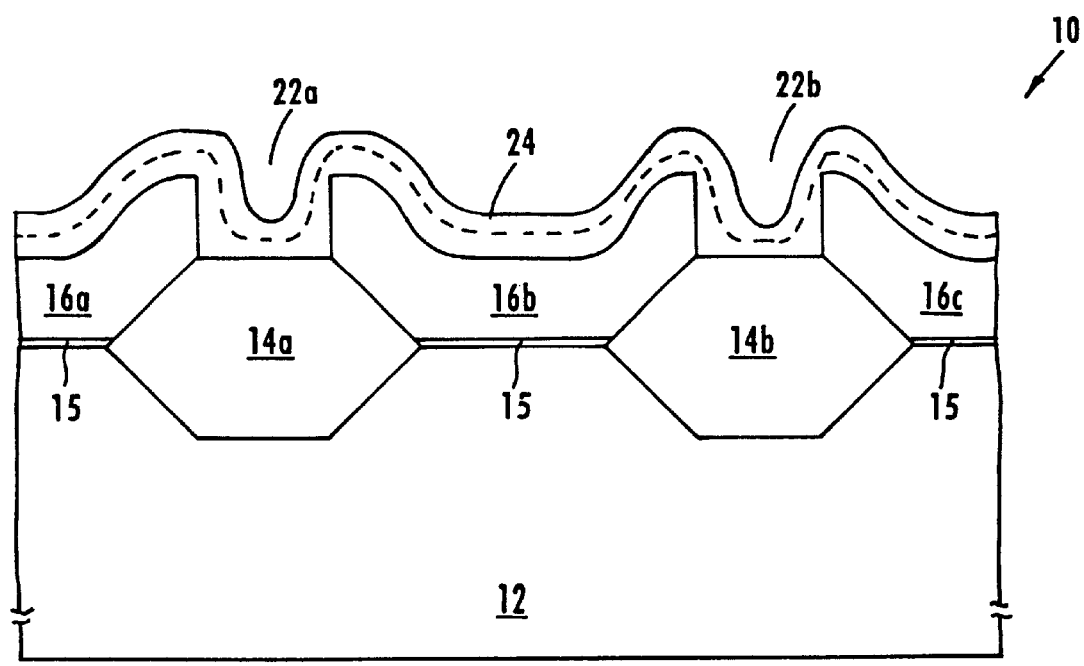

FIG. 2c depicts the portion 10 of FIG. 2b following deposition of interpoly dielectric layer 24 over floating gates 16a–c and within spaces 22a and 22b (see FIG. 2b). In certain preferred embodiments of the present invention, interpoly dielectric layer 24 is an ONO layer. An ONO layer can be formed, for example, by a three stage process in which a first film of silicon dioxide (e.g., about 50 Angstroms thick) is deposited or grown, followed by deposition of a second film of silicon nitride (e.g., about 80 Angstroms thick), and then a third film of silicon dioxide (e.g., about 40 Angstroms thick) is deposited or grown . The ONO layer provides a thin, highly-insulative dielectric layer that separates the floating gate 16 from the control gate 26, as depicted in FIG. 2d.

Figure 2D:
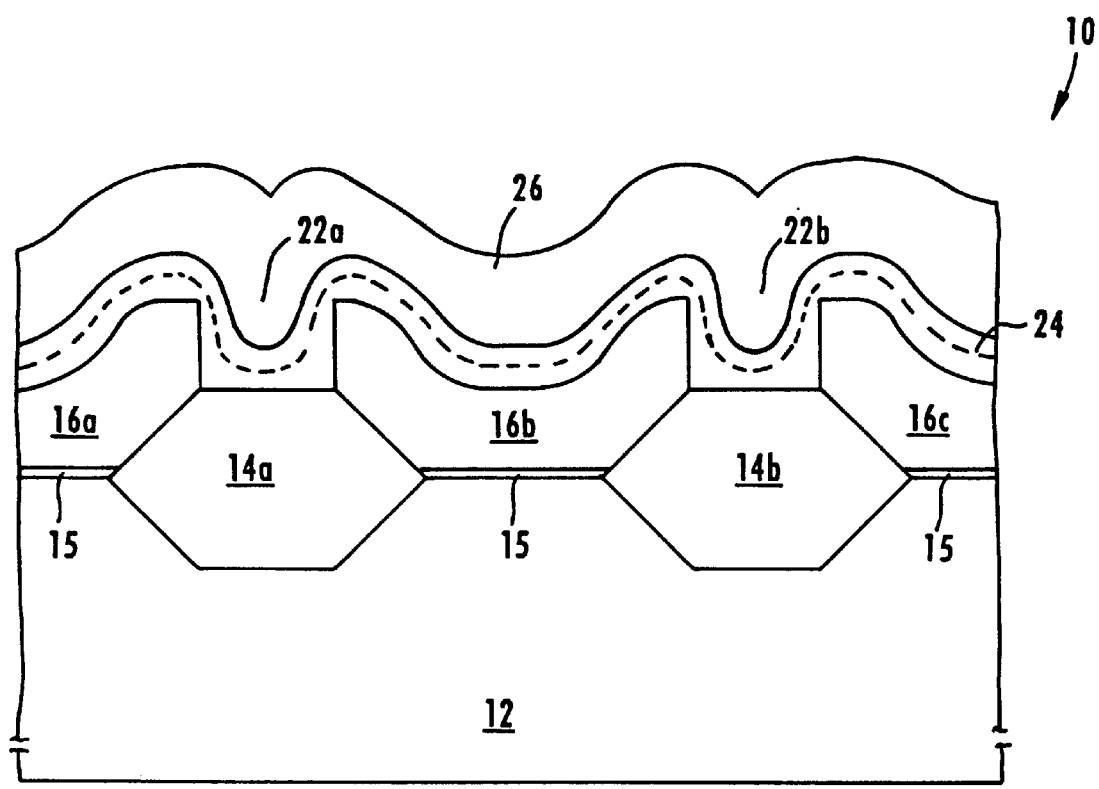
Figure 2E:
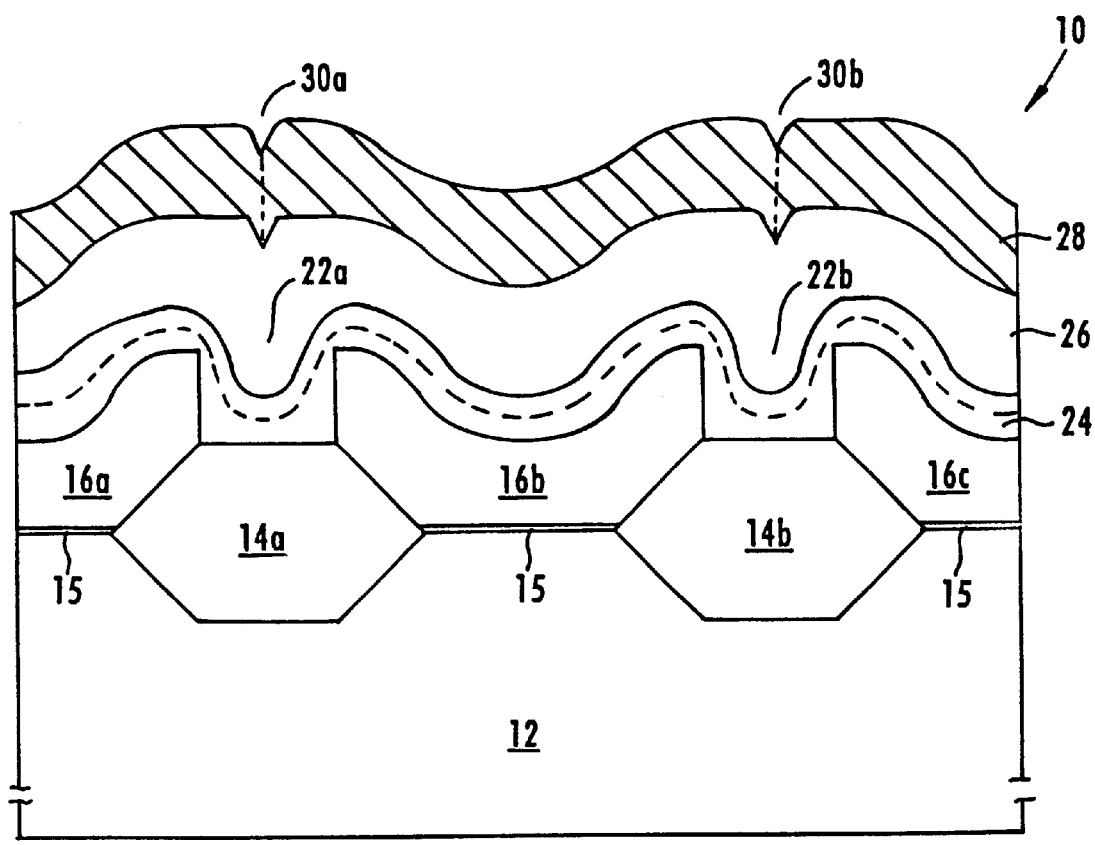

In FIG. 2d, the portion 10 of FIG. 2c has been further processed to include a conformal layer of polysilicon that is patterned to form the control gate 26. This polysilicon can be deposited to a thickness of about 1,200 Angstroms using conventional deposition techniques, such as, CVD and PECVD techniques. A silicide layer 28, for example tungsten silicide (e.g., $WSi_2$), is then formed on top of the polysilicon, as depicted in FIG. 2e. Although not visible from the word line cross-sectional perspective of FIG. 2d, the polysilicon is then selectively patterned using conventional polysilicon etching processes to form control gate 26.

Silicide layer 28 increases the conductivity of the control gate 26 and is designed to carry a significant portion of the programming current during the programming of the memory cells. It has been found, however, that silicide layer 28 can develop cracks, such as cracks 30a–30b in FIG. 2e, during subsequent thermal processing of portion 10. Cracks 30a–30b can extend partially through silicide layer 28, or in some cases can extend all the way through silicide layer 28 to control gate 26.

The cracking of silicide layer 28 appears to be caused by a combination of the severe topology of the spaces 22a–b (see FIG. 2b) and the subsequent thermal processing which typically is required to complete the manufacturing process. For example, subsequent thermal processes can include a high voltage anneal or thermal oxidation process associated with subsequent manufacturing steps. Thus, silicide layer 28, when subjected to the high temperatures of the subsequent thermal processes, tends to crack above the severe topology of the underlying layers. Cracks, such as, for example cracks 30a and 30b in FIG. 2e, tend to increase the resistance in the control gate 26 and degrade the performance of the flash memory and/or damage the semiconductor device.

It has been found that the cracking of silicide layer 28 is more prominent when the spaces 22a–b between the floating gates 16a–c are less than approximately 0.4 microns. In certain preferred embodiments of the present invention, spaces 22a–b are each approximately 0.26 microns wide, and the thickness of each of the floating gates 16a–c is approximately 900 to 1,100 Angstroms. The resulting topology has been found to cause a significant amount of cracking of silicide layer 28 during subsequent thermal processing.

By way of example, in certain situations the cracking of silicide layer 28 has caused the resistance of a word line to increase by 100 times.

In accordance with certain embodiments of the present invention, the cracking of silicide layer 28 is substantially reduced, if not entirely eliminated, by reducing the height of the floating gate 16. Thin floating gates 34a–c, see FIG. 3, reduce the severity of the underlying topology, which in turn alters the shapes of the overlying layers deposited over and above spaces 22a–b. This allows for increased step coverage when forming control gate 26 and silicide layer 28.

Figure 3:
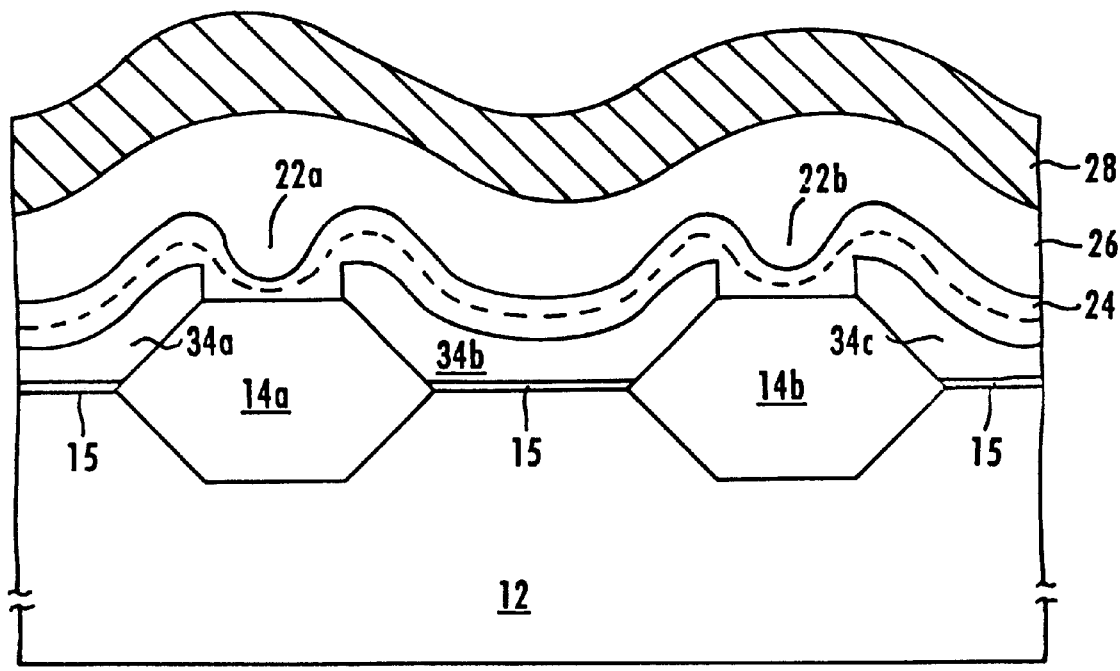
FIG. 3 depicts a cross-sectional view of a portion of a semiconductor device having a plurality of memory cells having thin floating gates that prevent cracking of the silicide layer on the control gate, in accordance with certain embodiments of the present invention.

By way of example, FIG. 3 depicts one embodiment of the present invention in which the portion 10 has been modified during fabrication to include thin floating gates 34a–c. Thin floating gates 34a–c, in certain embodiments, are deposited to a thickness less than about 900 Angstroms, and more preferably to a thickness of between about 100 and 700 Angstroms, and most preferably to a thickness of between about 400 and 600 Angstroms. The acceptable thickness of thin floating gates 34a–c is dependent upon the dimensions of the device. By way of example, in a device having spaces 22a–b about 2600 Angstroms wide, an acceptable thickness of thin floating gates 34a–c is between about 400 to 700 Angstroms.

Thin floating gates 34a–c can be formed using conventional deposition and etching techniques. Because thin floating gates 34a–c are not as thick as the conventional floating gates 16a–c, there is a corresponding need to increase the amount of doping in the polysilicon layer that is patterned to form thin floating gates 34a–c. For example, thin floating gates 34a–c are patterned, in certain embodiments, from a CVD formed polysilicon layer that is doped during deposition by introducing a doping gas (e,g,. $PH_3$) together with silane gas (e.g., $SiH_4$). The amount of dopant is dependent on the desired thickness of the polysilicon gate and the electrical charging/discharging requirements of the memory cell. The amount of dopant and compositioning of gas are readily determined given the selected thickness of the thin floating gates as discussed above.

In accordance with yet another embodiment of the present invention, the polysilicon layer that is patterned to form the thin floating gates 34a–c is doped using conventional thermal diffusion techniques by forming a phosphorous doped oxide on the top surface of the polysilicon and thermally diffusing the phosphorous into the polysilicon.

Although the present invention has been described and illustrated in detail, it is to be clearly understood that the same is by way of illustration and example only and is not be taken by way of limitation, the spirit and scope of the present invention being limited only by the terms of the appended claims.

What is claimed is:

1. A method for forming a floating gate in a non-volatile memory device, the method comprising:

forming at least two isolating regions, separated by an isolated region, within a substrate, a tunnel oxide being formed on the substrate in the isolated region between the at least two isolating regions;

forming a polysilicon layer on the tunnel oxide and the at least two isolating regions;

selectively patterning the layer of polysilicon layer to form at least two adjacent floating gates, the at least two adjacent floating gates each having a respective end wall formed over one of the isolating regions and being spaced apart from each other about 2,600 Å;

forming a dielectric layer on the at least two adjacent floating gates and on the at least two isolating regions in a region where the respective end walls of the at least two adjacent floating gates are spaced apart;

forming a control gate on at least a portion of the dielectric layer and at least partially located directly over at least a portion of each of the at least two adjacent floating gates, the control gate having a thickness of about 1,200 Å; and forming a silicide on at least a portion of the control gate, wherein the polysilicon layer is between approximately 100 and 700 Å thick, substantially reducing cracking of the silicide.

2. The method as recited in claim 1, wherein at least one of the isolating regions comprises silicon dioxide.

3. The method as recited in claim 1, wherein the floating gate comprises phosphorous.

4. The method as recited in claim 1, wherein the silicide comprises tungsten.

* * * * *